United States Patent
Yen

(10) Patent No.: US 7,538,605 B2
(45) Date of Patent: May 26, 2009

(54) AMPLIFIER DEVICE CAPABLE OF REDUCING OFFSET VOLTAGE

(75) Inventor: Chih-Jen Yen, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 84 days.

(21) Appl. No.: 11/772,241

(22) Filed: Jul. 1, 2007

(65) Prior Publication Data

US 2008/0258809 A1 Oct. 23, 2008

(30) Foreign Application Priority Data

Apr. 23, 2007 (TW) .............................. 96114203 A

(51) Int. Cl.
*H03F 1/02* (2006.01)

(52) U.S. Cl. ........................................................ 330/9

(58) Field of Classification Search ...................... 330/9; 327/124, 307

See application file for complete search history.

(56) References Cited

U.S. PATENT DOCUMENTS 4,365,204 A * 12/1982 Haque ........................ 330/9 X

* cited by examiner

*Primary Examiner*—Steven J Mottola
(74) *Attorney, Agent, or Firm*—Winston Hsu

(57) ABSTRACT

An amplifier device capable of reducing offset voltage includes an offset-voltage cancellation device, an input stage circuit, an output stage circuit, a pseudo output stage circuit, a switch circuit, and an output end. The switch circuit is coupled to the input stage circuit, the output stage circuit, and the pseudo output stage circuit, and is utilized for transmitting an amplified signal provided by the input stage circuit to the output stage circuit and transmitting a first feedback voltage provided by the output stage circuit to the input stage circuit or transmitting the amplified signal provided by the input stage circuit to the pseudo output stage circuit and transmitting a second feedback voltage provided by the pseudo output stage circuit to the input stage circuit according to an operating mode.

31 Claims, 7 Drawing Sheets

AMPLIFIER DEVICE CAPABLE OF REDUCING OFFSET VOLTAGE

BACKGROUND OF THE INVENTION

1. Field of the Invention

The present invention is related to an amplifier device capable of reducing offset voltage, and more particularly, to an amplifier device that completely cancels offset voltage through a pseudo output stage circuit.

2. Description of the Prior Art

An operational amplifier is an important component of all kinds of electronic devices, and is widely used in home appliances, industrial fields, scientific instruments, etc. Circuit designers usually use operational amplifiers for different operations, such as buffers, filters, analog to digital converters, etc.

An ideal operational amplifier has the following characters: infinite input impedance, zero output impedance, infinite open loop gain, infinite common mode rejection ratio, infinite frequency bandwidth. However, due to limitations of semiconductor processes and integrated circuit techniques, there are difficulties in realizing an ideal operational amplifier. In order to present properties of a real operational amplifier, an offset voltage is used for representing the non-ideal effects in the prior art. In the current technology, many offset voltage cancellation methods and related devices are presented.

For example, please refer to FIG. 1, which illustrates a schematic diagram of a prior art amplifier device 100 capable of reducing offset voltage. The amplifier device 100 comprises an operational amplifier 110, an offset voltage cancellation device 120, and an equivalent voltage source 102. The gain of the operational amplifier 110 is 1, referring that an output voltage Vo equals an input voltage Vi. The operational amplifier 110 comprises an input stage circuit 1101 and an output stage circuit 1102. The equivalent voltage source 102 (which does not exist on an actual circuit) represents the offset voltage Vos that is generated by the non-ideal effect of the operational amplifier 110. The offset voltage cancellation device 120 is utilized for compensating the offset voltage, which comprises switches S11, S12, S21, and a capacitor Cs.

The offset voltage cancellation device 120 reduces the offset voltage Vos effects with a virtual short characteristic of the operational amplifier 110. Firstly, when the amplifier device 100 operates in an offset voltage storing mode, the switches S11 and S12 are turned on, and the switch S21 is turned off, so that the voltage difference (which is the offset voltage Vos) between a positive input end and an output end of the operational amplifier 110 charges the capacitor Cs. Then, when the amplifier device 100 operates in an offset voltage cancellation mode, the switch S21 is turned on, and the switches S11 and S12 are turned off. The amount and the polarity of the voltage difference stored between the two ends of the capacitor Cs can compensate the effect of the offset voltage Vos, to make the voltage difference between the positive end and the output end Vo become 0, so as to reduce the offset voltage Vos.

When the output voltage Vo of the amplifier device 100 changes with the input voltage Vi, the offset voltage cancellation device 120 can compensate the effect of the offset voltage Vos through turning switches S11, S12, S21 on and off. However, when the output end of the operational amplifier 110 is coupled to a capacitor, the duration when the voltage Vo changes with the input voltage Vi is affected by the slew rate of the operational amplifier 110, which means that the output voltage Vo does not change with the input voltage Vi synchronously, so that the voltage difference between the output voltage Vo and the input voltage Vi does not equal 0 during a certain duration. Under this condition, the voltage stored in the capacitor Cs transiently changes with the offset of the output voltage Vo, which does not equal to the dc offset voltage Vos. As a result, when the amplifier device 100 operates in the offset voltage cancellation mode, the offset voltage Vos can not be completely reduced and affects performances and the application range of the amplifier device 100.

SUMMARY OF THE INVENTION

It is therefore a primary objective of the claimed invention to provide an amplifier device capable of reducing offset voltage.

The present invention discloses an operational amplifier capable of reducing offset voltage, which comprises an offset voltage cancellation device comprising an input voltage reception end, a first output end, and a second output end, for receiving an input voltage through the input voltage reception end, and compensating the offset voltage according to an operating mode, so as to output a compensating result from the first output end and the second output end, an input stage circuit for outputting an amplified signal according to the compensating result outputted from the first output end and the second output end of the offset voltage cancellation device, an output stage circuit for outputting an amplified voltage and a first feedback voltage according to the amplified signal outputted from the input stage circuit, a pseudo output stage circuit for outputting a second feedback voltage according to the amplified signal outputted from the input stage circuit, a switch circuit coupled to the input stage circuit, the output stage circuit, and the pseudo output stage circuit, for transmitting the amplified signal outputted from the input stage circuit to the output stage circuit and transmitting the first feedback voltage outputted from the output stage circuit to the input stage circuit, or transmitting the amplified signal outputted from the input stage circuit to the pseudo output stage circuit and transmitting the second feedback voltage outputted from the pseudo output stage circuit to the input stage circuit, according to the operating mode, and a voltage output end for outputting the amplified voltage from the output stage circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
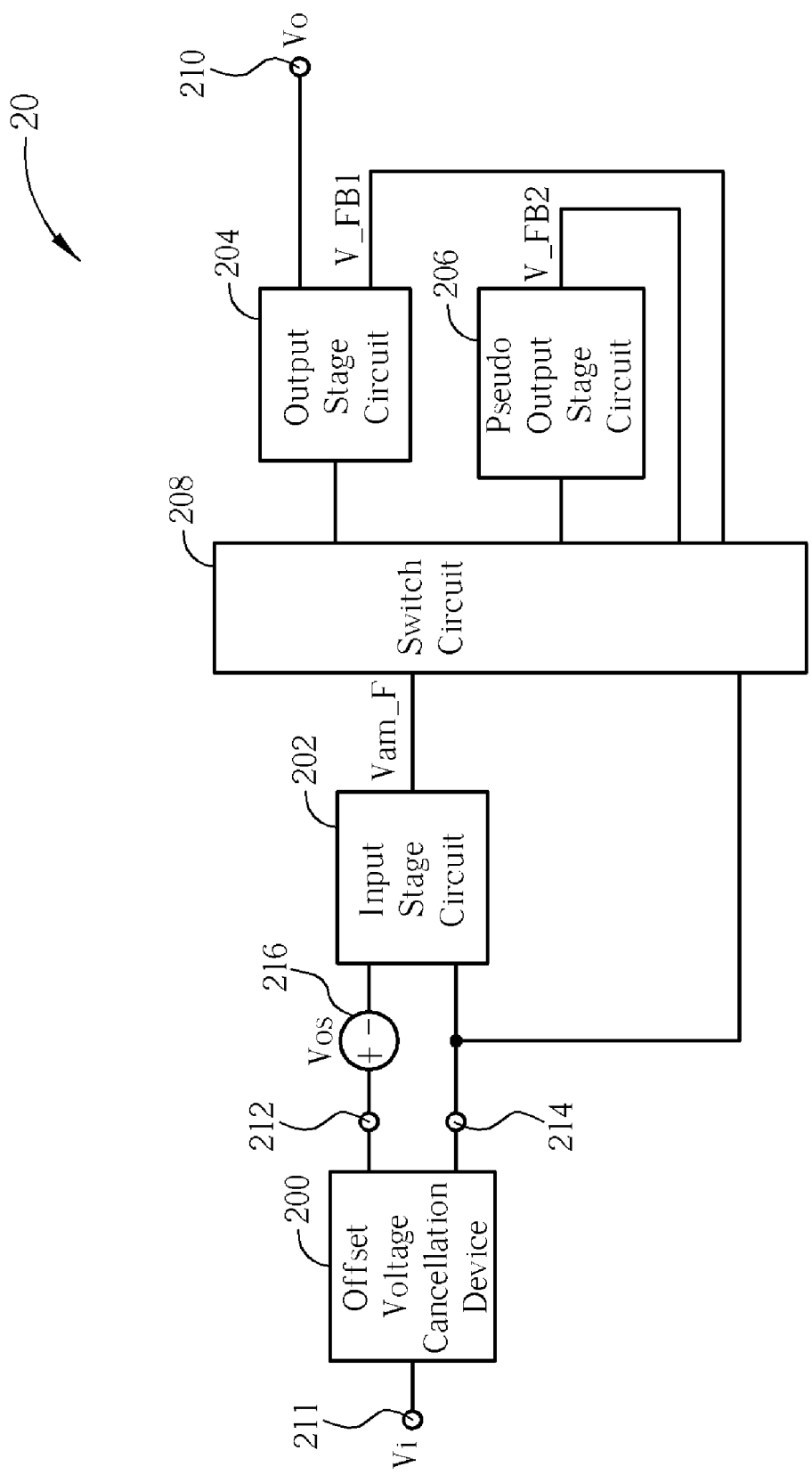
FIG. 2 illustrates a schematic diagram of an amplifier device capable of reducing offset voltage according to an embodiment of the present invention.

Please refer to FIG. 2, which illustrates a schematic diagram of an amplifier device 20 capable of reducing offset voltage according to an embodiment of the present invention. The amplifier device 20 comprises an offset voltage cancellation device 200, an input stage circuit 202, an output stage circuit 204, a pseudo output stage circuit 206, a switch circuit 208, and a voltage output end 210. The offset voltage cancellation device 200 comprises an input voltage reception end 211, a first output end 212, and a second output end 214. The offset voltage cancellation device 200 receives an input voltage Vi through the input voltage reception end 211, and compensates the offset voltage effect according to an operation mode, so as to output an offset voltage compensation result to the input stage circuit 202 through the first output end 212 and the second output end 214. Then, the input stage circuit 202 outputs a front stage amplified signal Vam_F accordingly. According to the front stage amplified signal Vam_F outputted from the input stage circuit 202, the output stage circuit 204 can output a voltage Vo and a first feedback voltage V_FB1, and the pseudo output stage circuit 206 can output a second feedback voltage V_FB2. The switch circuit 208 is coupled to the input stage circuit 202, the output stage circuit 204, and the pseudo output stage circuit 206. According to different operation modes, the switch circuit 208 determines whether to transmit the front stage amplified signal Vam_F to the output stage circuit 204, and feedback the first feedback voltage V_FB1 outputted from the output stage circuit 204 to the input stage circuit 202, or to transmit the front stage amplified signal Vam_F to the pseudo output stage circuit 206, and feedback the second feedback voltage V_FB2 outputted from the pseudo output stage circuit 206 to the input stage circuit 202. The voltage output end 210 is used for outputting the voltage Vo. In addition, an equivalent voltage source 216 (which does not exist on actual circuits) represents the offset voltage Vos that is generated by the non-ideal effect of the amplifier device 20.

The amplifier device 20 operates as the follows. Firstly, when the amplifier device 20 operates in an offset voltage storing mode, the offset voltage cancellation device 200 stores the offset voltage Vos, and the switch circuit 208 transmits the front stage amplified signal Vam_F to the pseudo output stage circuit 206 and feedbacks the second feedback voltage V_FB2 outputted from the pseudo output stage circuit 206 to the input stage circuit 202, which means that the output stage circuit 204 does not work. Under this condition, the voltage stored in the offset voltage cancellation device 200 is not affected by the load variation of the output stage circuit 204. When the amplifier device 20 operates in an offset voltage cancellation mode, the switch circuit 208 transmits the front stage amplified signal Vam_F to the output stage circuit 204 and feedbacks the first feedback voltage V_FB1 outputted from the output stage circuit to the input stage circuit 202, which means that the pseudo output stage circuit 206 does not work. Under this condition, the output voltage Vo follows the input voltage Vi, and the offset voltage Vos can be reduced precisely.

In other words, when operating in the offset voltage storing mode, the pseudo output stage circuit 206 works, while the output stage circuit 204 does not. Since the pseudo output stage circuit 206 is not coupled to the voltage output end 210, the load coupled to the voltage output end 210 does not affect the second feedback voltage V_FB2 outputted from the pseudo output stage circuit 206. Hence, when operating in the offset voltage storing mode, the offset voltage cancellation device 200 can store the offset voltage Vos precisely. In this way, when operating in the offset voltage cancellation mode, the offset voltage cancellation device 200 can completely compensate the effect of the offset voltage Vos, increasing circuit performance of the amplifier device 20.

Note that, the amplifier device 20 in FIG. 2 is an exemplary embodiment of the present invention. Those skilled the art can make different modifications, such as realizing the output stage circuit 204 with a circuit capable of enhancing a slew rate. In addition, the connections between components represent signal transmission routes, and the amount of actual circuits can vary depending on different applications.

Figure 1:
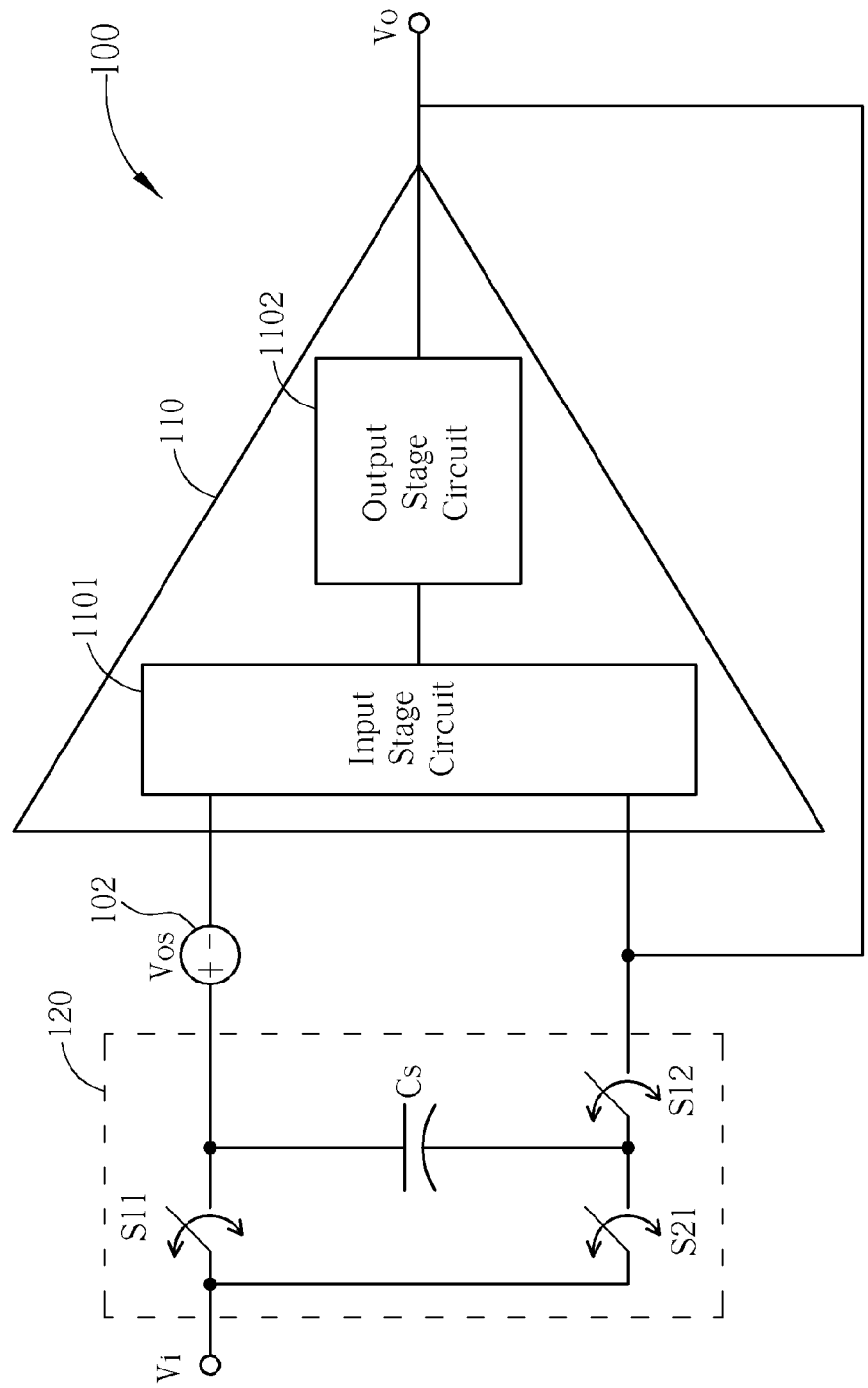
FIG. 1 illustrates a schematic diagram of a prior art amplifier device capable of reducing offset voltage.
Figure 3:
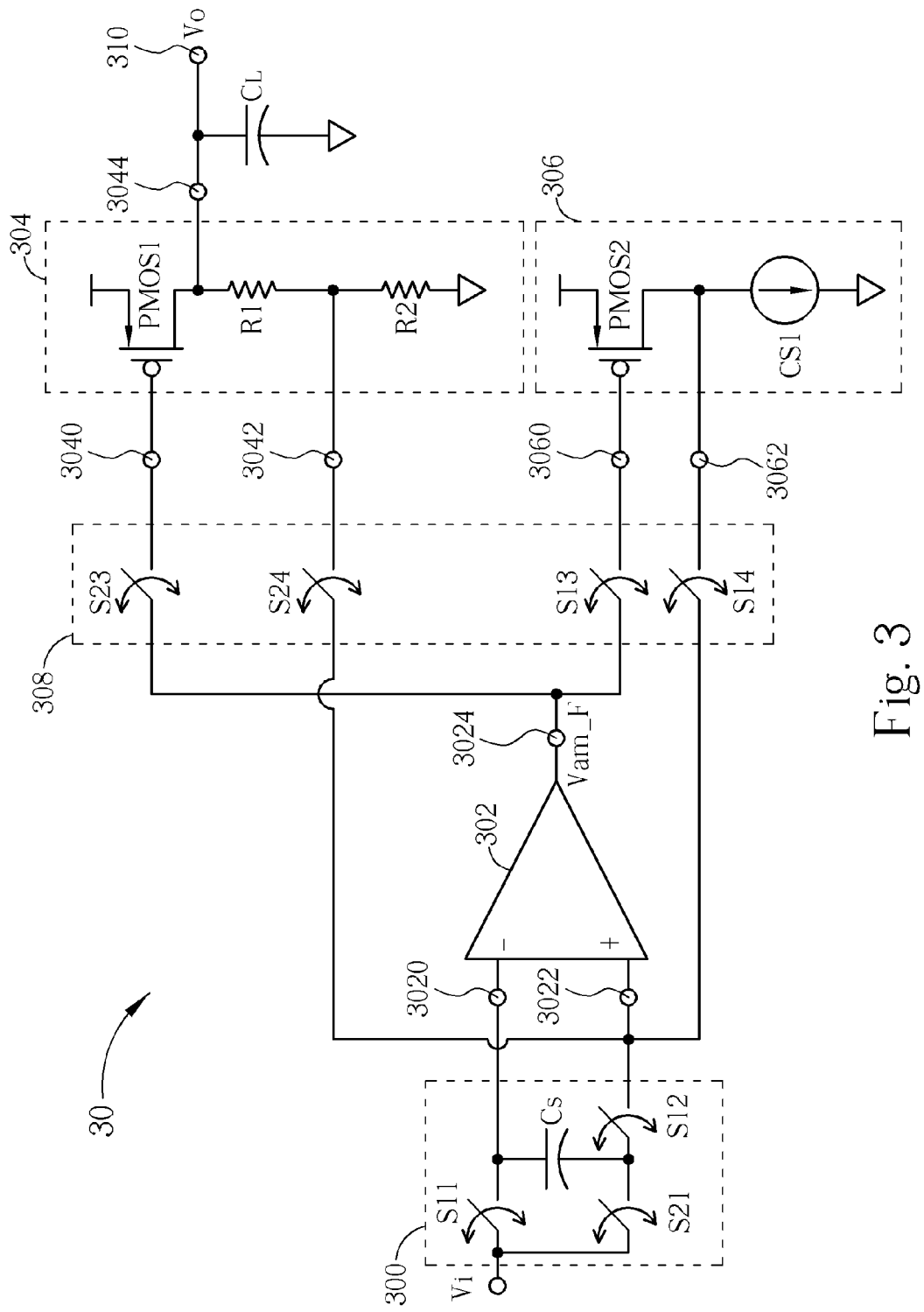
FIG. 3 illustrates a schematic diagram of a voltage regulator device according to the amplifier device shown in FIG. 2.

For example, please refer to FIG. 3, which illustrates a schematic diagram of a voltage regulator device 30 according to the amplifier device 20 shown in FIG. 2. The voltage regulator device 30 comprises an offset voltage cancellation device 300, an input stage circuit 302, an output stage circuit 304, a pseudo output stage circuit 306, a switch circuit 308, a voltage output end 310, and a capacitor $C_L$. The input voltage Vi of the voltage regulator device 30 is a fixed value, while the output voltage Vo stored in the capacitor $C_L$ changes with the load circuit operation. The structure of the offset voltage cancellation device 300 is the same as the offset voltage cancellation device 120 shown in FIG. 1, and is formed by switches S111, S12, S21 and a capacitor Cs. The input stage circuit 302 receives output signals from the offset voltage cancellation device 300 through a first input end 3020 and a second input end 3022, and outputs a front stage amplified signal Vam_F through an output end 3024 after operations of a front stage processing unit (not illustrated in FIG. 3). The switch circuit 308 is composed of switches S23, S24, S13 and S14, and controls the connection between the input stage circuit 302 and the output stage circuit 304 or the pseudo output stage circuit 306. When the switches S23 and S24 are turned on, the output stage circuit 304 receives the front stage amplified signal Vam_F through an input end 3040. After operations of a back stage processing unit (composed of a p-type metal oxide semiconductor PMOS1 and resistors R1 and R2), the output stage circuit 304 outputs the voltage Vo to the capacitor $C_L$ through a output end 3044, and outputs feedback signals to the second input end 3022 of the input stage circuit 302 through a feedback voltage output end 3042. In the same way, when the switches S13, S14 are turned on, the pseudo output stage circuit 306 receives the front stage amplified signal Vam_F through an input end 3060, and after operations of a back stage processing unit (composed of a p-type metal oxide semiconductor PMOS2 and a current source CS1), the pseudo output stage circuit 306 outputs feedback signals to the second input end 3022 of the input stage circuit 302 through a feedback voltage output end 3062.

In FIG. 3, the offset voltage cancellation device 300 and the switch circuit 308 control the switches S11, S12, S13, S14, S21, S23, S24 according to different operation modes. When the voltage regulator device 30 operates in the offset voltage storing mode, the switches S11, S12, S13, S14 are turned on, and the switches S21, S23, S24 are turned off, so that only the pseudo output stage circuit 306 works. Therefore, the input stage circuit 302 and the pseudo output stage circuit 306 forms a unity-gain operational amplifier, and the capacitor Cs stores the offset voltage. Under this condition, since the pseudo output stage circuit 306 is not coupled to the voltage output end 310, the capacitor $C_L$ coupled to the voltage output end 310 does not affect the second feedback voltage outputted from the pseudo output stage circuit 306. Hence, the voltage stored in the capacitor Cs is not affected by the variation of the load of the output stage circuit 304. Moreover, when the voltage regulator device 30 operates in the offset voltage cancellation mode, the switches S11, S12, S13, S14 are turned off, and the switches S21, S23, S24 are turned on, so that only the output stage circuit 304 works. Therefore, the output voltage Vo changes with the input voltage Vi, and the offset voltage Vos can be reduced precisely.

In other words, when operating in the offset voltage storing mode, the pseudo output stage circuit 306 works, while the output stage circuit 304 does not. Since the pseudo output stage circuit 306 is not coupled to the voltage output end 310, the load coupled to the voltage output end 310 does not affect the feedback voltage outputted from the pseudo output stage circuit 306. Hence, when operating in the offset voltage storing mode, the capacitor Cs can store the offset voltage Vos precisely. In this way, when operating in the offset voltage cancellation mode, the offset voltage cancellation device 300 can compensate the effect of the offset voltage Vos more precisely, so as to enhance the accuracy of the voltage regulator device 30.

In FIG. 3, the pseudo output stage circuit 306 is a class-A output stage circuit, and the output stage circuit 304 is composed of a transistor PMOS1 and resistors R1, R2. Certainly, the output stage circuit 304 can also be substituted with the class-A output stage circuit. Please refer to FIG. 4, which illustrates a schematic diagram of an amplifier device 40 according to an embodiment of the present invention. The circuit structure of the amplifier device 40 resembles the voltage regulator device 30 shown in FIG. 3, while the output stage circuit 404 is a class-A output stage circuit. Related operations will not be narrated in detail.

Figure 5:
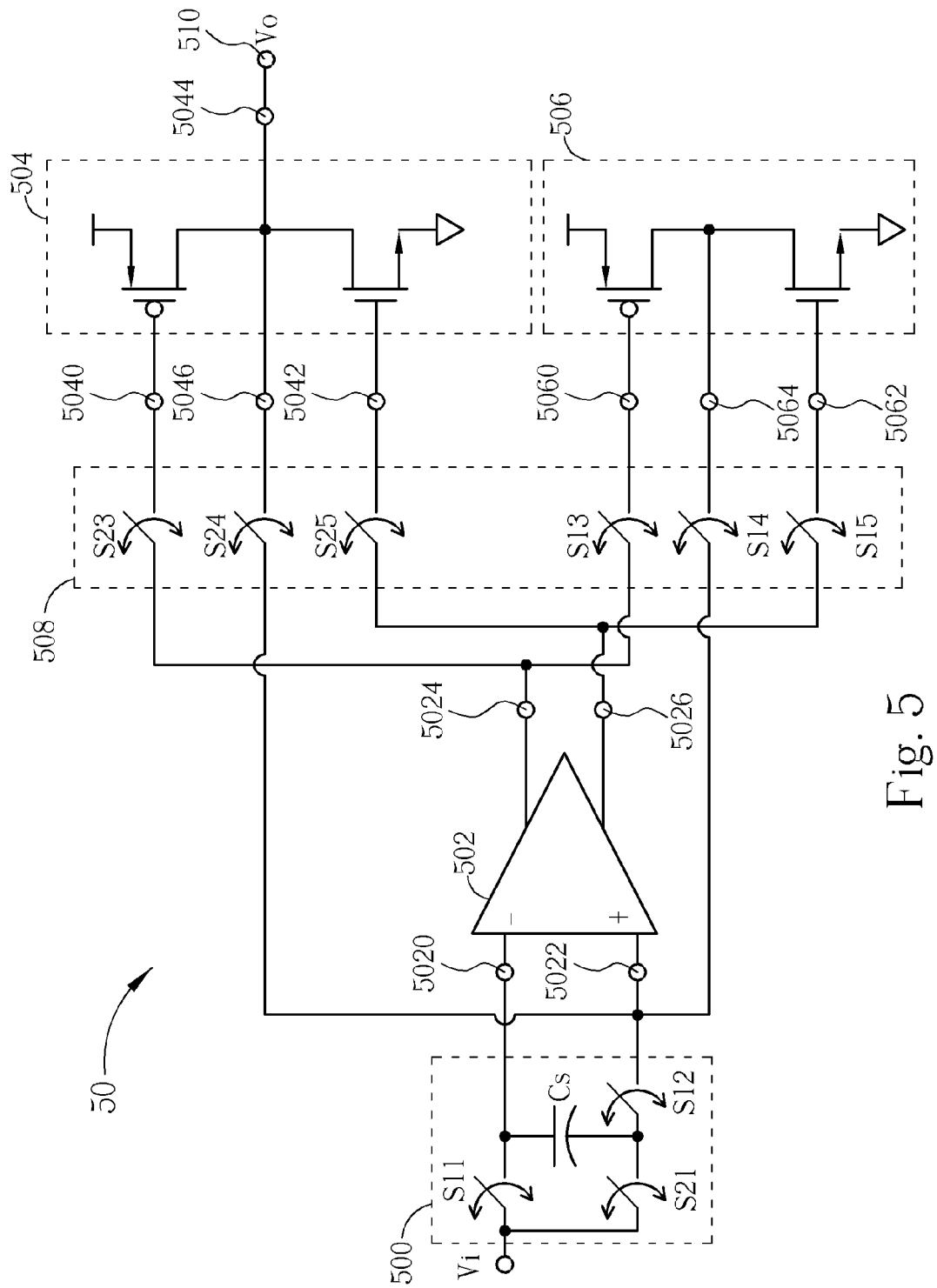
FIG. 5 illustrates a schematic diagram of an amplifier device according to an embodiment of the present invention.

As mentioned above, in FIG. 2, the connections between components indicate the signal transmission routes, and the actual circuit amount can change depending on different applications. For example, when the amplifier device 20 in FIG. 2 is realized with a rail to rail structure, the input stage circuit 202 comprises two output ends. Please refer to FIG. 5, which illustrates a schematic diagram of an amplifier device 50 according to an embodiment of the present invention. The amplifier device 50 comprises an offset voltage cancellation device 500, an input stage circuit 502, an output stage circuit 504, a pseudo output stage circuit 506, a switch circuit 508, and a voltage output end 510. The offset voltage cancellation device 500 is the same as the offset voltage cancellation device 200, and utilized for compensating offset voltage effects. The input stage circuit 502 receives signals outputted from the offset voltage cancellation device 500 through a first input end 5020 and a second input end 5022, and outputs a front stage amplified signal through a first output end 5024 and a second output end 5026 after operations of a front stage processing unit (not illustrated in FIG. 5). The switch circuit 508 is composed of switches S23, S24, S25, S13, S14 and S15, and utilized for controlling the connection between the input stage circuit 502 and the output stage circuit 504 or the pseudo output stage circuit 506. When the switches S23, S24, S25 are turned on, the output stage circuit 504 receives the front stage amplified signal through a first input end 5040 and a second input end 5042. After operations of a back stage processing unit (composed of p-type and n-type metal oxide semiconductor transistors), the output stage circuit 504 outputs an output voltage Vo through an output end 5044, and outputs feedback signals to the second input end 5022 of the input stage circuit 502 through a feedback voltage output end 5046. In the same way, when the switches S13, S14, S15 are turned on, the pseudo output stage circuit 506 receives the front stage amplified signal through a first input end 5060 and a second input end 5062, and outputs feedback signals to the second input end 5022 of the input stage circuit 502 through a feedback voltage output end 5064 after operations of a back stage processing unit (composed of p-type and n-type metal oxide semiconductor transistors).

Figure 4:
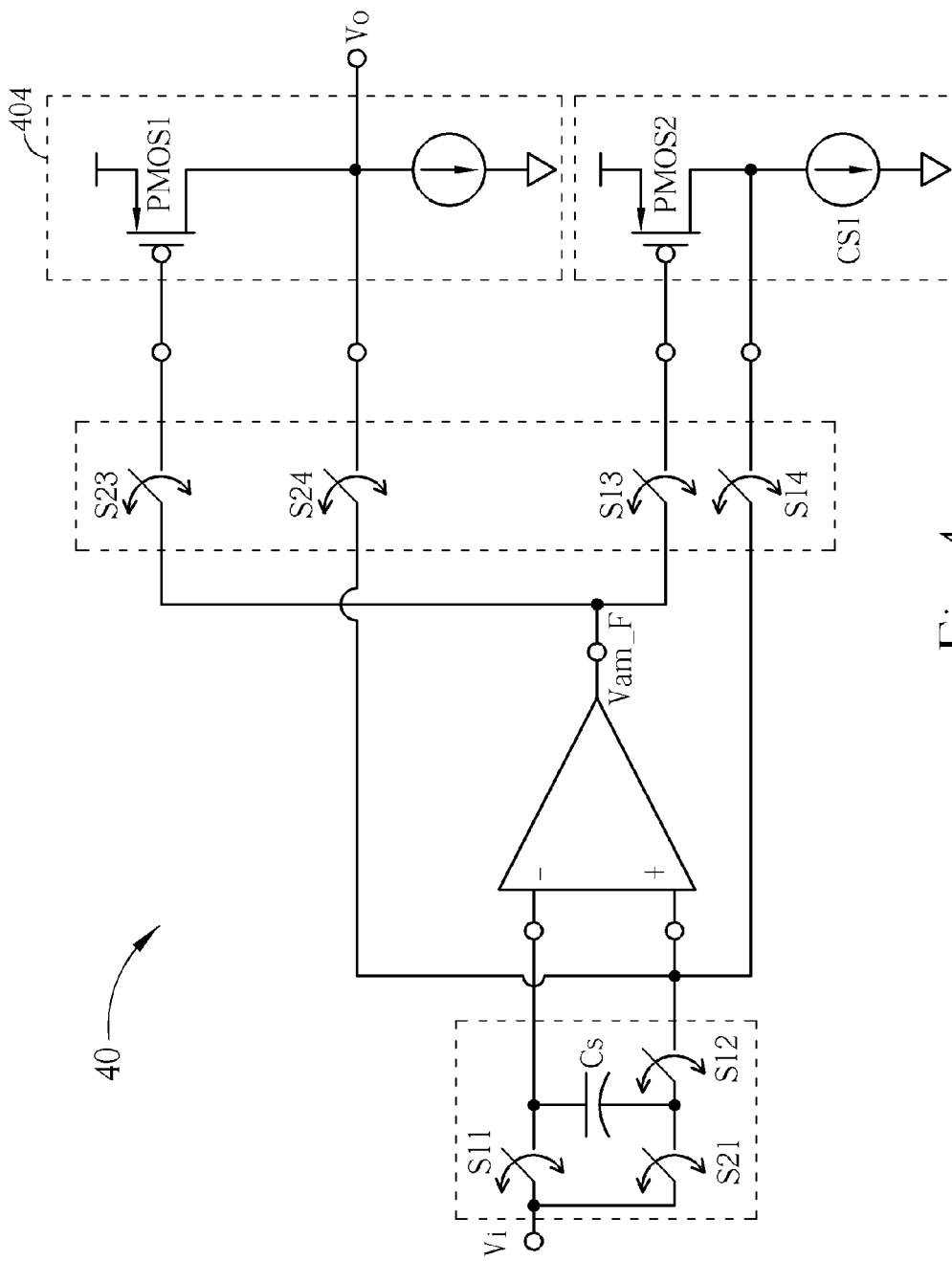
FIG. 4 illustrates a schematic diagram of an amplifier device according to an embodiment of the present invention.

The amplifier device 50 has a rail to rail structure, and the operating method resembles the voltage regulator device 30 shown in FIG. 3 or the amplifier device 40 shown in FIG. 4, and will not be narrated in detail.

Figure 6:
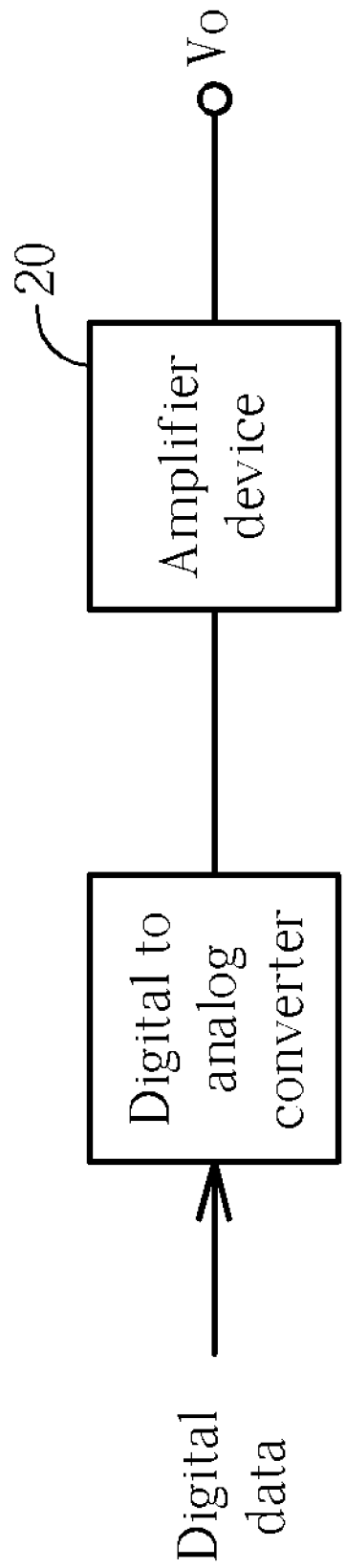
FIG. 6 illustrates a schematic diagram of a digital to analog converter according to the amplifier device shown in FIG. 2.
Figure 7:
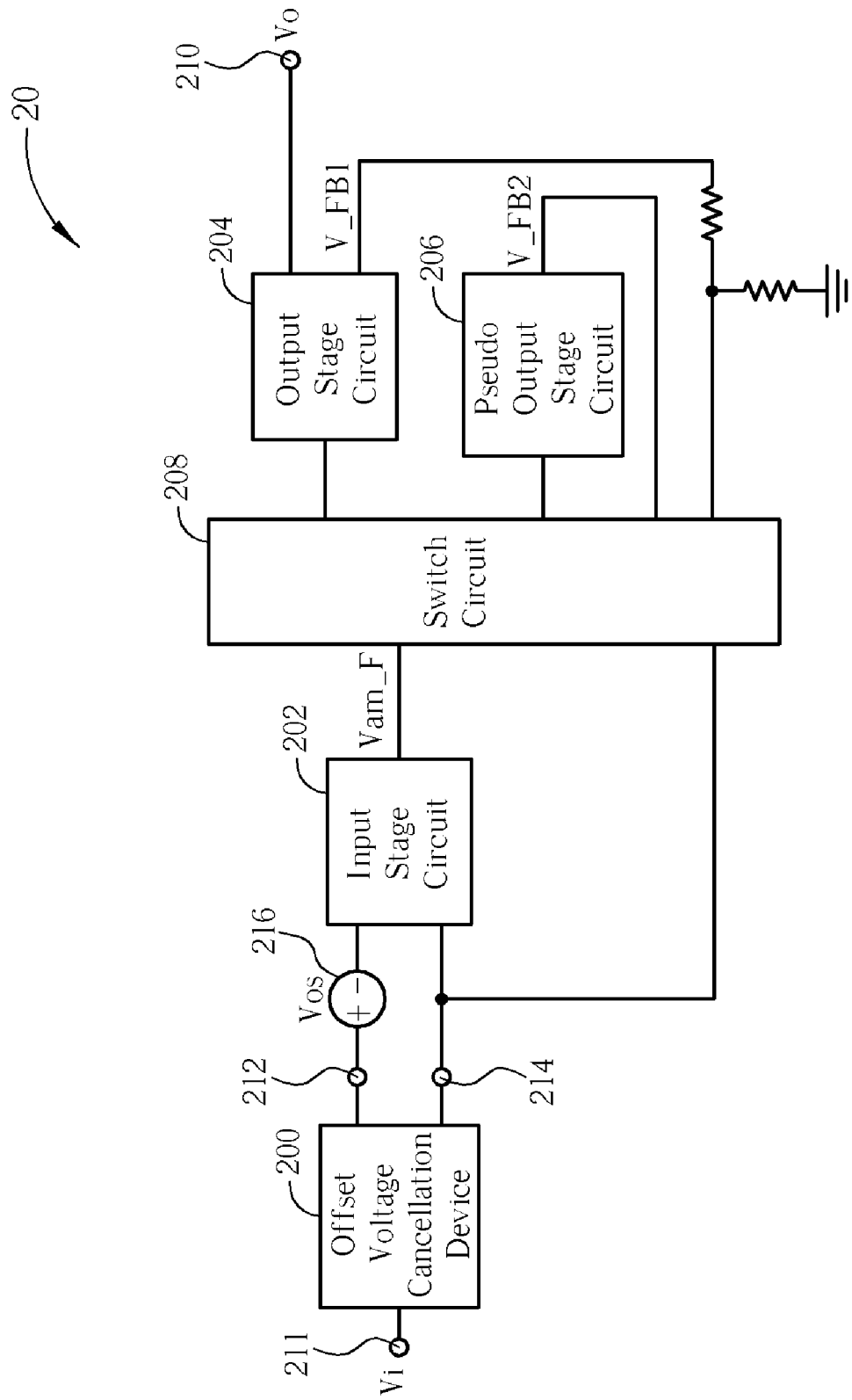
FIG. 7 illustrates a schematic diagram of a gain amplifier according to the amplifier device shown in FIG. 2.

Hence, in the present invention, since the pseudo output stage circuit is not coupled to the voltage output end, the feedback voltage outputted from the pseudo output stage circuit is not affected by the load coupled to the voltage output end. Therefore, when operating in the offset voltage storing mode, the offset voltage cancellation device can store the offset voltage Vos precisely, so that the offset voltage cancellation device can reduce the effects of the offset voltage Vos, to enhance accuracy and increase the application range. For example, in FIG. 6, the amplifier device 20 realizes an output buffer of a digital to analog converter. In FIG. 7, the amplifier device 20 realizes a gain amplifier, where resistors are added to a feedback route of the output stage circuit 204.

In summary, the present invention uses the pseudo output stage circuit to ensure that the offset voltage stored in the offset voltage cancellation device is not affected by the load, making the offset voltage cancellation device able to reduce the offset voltage effect more precisely, so as to enhance the accuracy and widen the application range.

Those skilled in the art will readily observe that numerous modifications and alterations of the device and method may be made while retaining the teachings of the invention.

What is claimed is:

1. An amplifier device capable of reducing offset voltage comprising:

an offset voltage cancellation device comprising an input voltage reception end, a first output end, and a second output end, for receiving an input voltage through the input voltage reception end, and compensating the offset voltage according to an operating mode, so as to output a compensating result from the first output end and the second output end;

an input stage circuit for outputting an amplified signal according to the compensating result outputted from the first output end and the second output end of the offset voltage cancellation device;

an output stage circuit for outputting an amplified voltage and a first feedback voltage according to a front stage amplified signal outputted from the input stage circuit;

a pseudo output stage circuit for outputting a second feedback voltage according to the front stage amplified signal outputted from the input stage circuit;

a switch circuit coupled to the input stage circuit, the output stage circuit, and the pseudo output stage circuit, for transmitting the front stage amplified signal outputted from the input stage circuit to the output stage circuit and transmitting the first feedback voltage outputted from the output stage circuit to the input stage circuit, or transmitting the front stage amplified signal outputted from the input stage circuit to the pseudo output stage circuit and transmitting the second feedback voltage outputted from the pseudo output stage circuit to the input stage circuit, according to the operating mode; and a voltage output end for outputting the amplified voltage from the output stage circuit.

2. The amplifier device of claim 1, wherein the offset voltage cancellation device comprises:

a first switch comprising a first end coupled to the input voltage reception end, and a second end coupled to the first output end;

a second switch comprising a first end, and a second end coupled to the second output end;

a third switch comprising a first end coupled to the input voltage reception end, and a second end coupled to the first end of the second switch; and a capacitor comprising a first end coupled between the second end of the first switch and the first output end, and a second end coupled between the first end of the second switch and the second end of the third switch.

3. The amplifier device of claim 2, wherein the first switch and the second switch turn on and the third switch turns off when the operation mode is an offset voltage storing mode.

4. The amplifying device of claim 2, wherein the first switch and the second switch turn off and the third switch turns on when the operation mode is an offset voltage cancellation mode.

5. The amplifier device of claim 1, wherein the input stage circuit comprises:
    a first input end coupled to the first output end of the offset voltage cancellation device;
    a second input end coupled to the second output end of the offset voltage cancellation device;
    an output end; and
    a front stage processing unit coupled to the first input end, the second input end, and the output end, for outputting the front stage amplified signal through the output end according to signals of the first input end and the second input end;
    wherein the second input end and the first input end are virtual-short.

6. The amplifier device of claim 5, wherein the output stage circuit comprises:
    an input end;
    a feedback voltage output end;
    an output end; and
    a back stage processing unit for outputting the first feedback voltage through the feedback voltage output end and the amplified voltage through the output end according to the front stage amplified signal received from the input end.

7. The amplifier device of claim 6, wherein the back stage processing unit comprises:
    a transistor comprising a first end coupled to the input end, a second end coupled to a power generator, and a third end coupled to the output end, for conducting connection between the second end and the third end according to signals of the first end;
    a first resistor comprising one end coupled between the third end of the transistor and the output end, and another end coupled to the feedback voltage output end; and
    a second resistor comprising one end coupled between the feedback voltage output end and the first resistor, and another end coupled to a ground.

8. The amplifier device of claim 7, wherein the transistor is a p-type metal oxide semiconductor transistor, the first end is a gate, the second end is a source, and the third end is a drain.

9. The amplifier device of claim 6, wherein the back stage processing unit comprises:
    a transistor comprising a first end coupled to the input end, a second end coupled to a power generator, and a third end coupled between the output end and the feedback voltage output end, for conducting connection between the second end and the third end according to signals of the first end; and
    a current source coupled to the output end, the feedback voltage output end, and the third end of the transistor, for drawing current.

10. The amplifier device of claim 9, wherein the transistor is a p-type metal oxide semiconductor transistor, the first end is a gate, the second end is a source, and the third end is a drain.

11. The amplifier device of claim 6, wherein the pseudo output stage circuit comprises:
    an input end;
    a feedback voltage output end; and
    a back stage processing unit for outputting the second feedback voltage through the feedback voltage output end according to the front stage amplified signal received from the input end.

12. The amplifier device of claim 11, wherein the back stage processing unit comprises:
    a transistor comprising a first end coupled to the input end, a second end coupled to a power generator, and a third end coupled to the feedback voltage output end, for conducting connection between the second end and the third end according to signals of the first end; and
    a current source coupled to the feedback voltage output end and the third end of the transistor, for drawing current.

13. The amplifier device of claim 12, wherein the transistor is a p-type metal oxide semiconductor transistor, the first end is a gate, the second end is a source, and the third end is a drain.

14. The amplifier device of claim 11, wherein the switch circuit comprises:
    a first switch comprising a first end coupled to the output end of the input stage circuit, and a second end coupled to the input end of the output stage circuit;
    a second switch comprising a first end coupled to the output end of the input stage circuit, and a second end coupled to the input end of the pseudo output stage circuit;
    a third switch comprising a first end coupled to the second input end of the input stage circuit, and a second end coupled to the feedback voltage output end of the output stage circuit; and
    a fourth switch comprising a first end coupled to the second input end of the input stage circuit, and a second end coupled to the feedback voltage output end of the pseudo output stage circuit.

15. The amplifier device of claim 14, wherein the second switch and the fourth switch turn on, and the first switch and the third switch turn off when the operation mode is an offset voltage storing mode.

16. The amplifier device of claim 14, wherein the second switch and the fourth switch turn off, and the first switch and the third switch turn on when the operation mode is an offset voltage cancellation mode.

17. The amplifier device of claim 1, wherein the input stage circuit is a rail to rail input stage circuit, and comprises:
    a first input end coupled to the first output end of the offset voltage cancellation device;
    a second input end coupled to the second output end of the offset voltage cancellation device;
    a first output end;
    a second output end; and
    a front stage processing unit coupled to the first input end, the second input end, the first output end, and the second output end, for outputting the front stage amplified signal through the first output end and the second output end according to signals of the first input end and the second input end;
    wherein the second input end and the first input end are virtual-short.

18. The amplifier device of claim 17, wherein the output stage circuit comprises:
a first input end;
a second input end;
a feedback voltage output end;
an output end; and
a back stage processing unit for outputting the first feedback voltage through the feedback voltage output end and outputting the amplified voltage through the output end according to the front stage amplified signal received from the first input end and the second input end.

19. The amplifier device of claim 18, wherein the back stage processing unit comprises:
a first transistor comprising a first end coupled to the first input end, a second end coupled to a power generator, and a third end coupled between the output end and the feedback voltage output end, for conducting connection between the second end and the third end according to signals of the first end; and
a second transistor comprising a first end coupled to the second input end, a second end coupled to the output end, the feedback voltage output end, and the third end of the first transistor, and a third end coupled to a ground, for conducting connection between the second end and the third end according to signals of the first end.

20. The amplifier device of claim 19, wherein the first transistor is a p-type metal oxide semiconductor transistor, the first end is a gate, the second end is a source, and the third end is a drain.

21. The amplifier device of claim 19, wherein the second transistor is an n-type metal oxide semiconductor transistor, the first end is a gate, the second end is a drain, and the third end is a source.

22. The amplifier device of claim 18, wherein the pseudo output stage circuit comprises:
a first input end;
a second input end;
a feedback voltage output end; and
a back stage processing unit for outputting the second feedback voltage through the feedback voltage output end according to the front stage amplified signal received from the first input end and the second input end.

23. The amplifier device of claim 22, wherein the back stage processing unit comprises:
a first transistor comprising a first end coupled to the first input end, a second end coupled to a power generator, and a third end coupled to the feedback voltage output end, for conducting connection between the second end and the third end according to signals of the first end; and
a second transistor comprising a first end coupled to the second input end, a second end coupled between the feedback voltage output end and the third end of the first transistor, and a third end coupled to a ground, for conducting connection between the second end and the third end according to signals of the first end.

24. The amplifier device of claim 23, wherein the first transistor is a p-type metal oxide semiconductor transistor, the first end is a gate, the second end is a source, and the third end is a drain.

25. The amplifier device of claim 23, wherein the second transistor is an n-type metal oxide semiconductor transistor, the first end is a gate, the second end is a drain, and the third end is a source.

26. The amplifier device of claim 22, wherein the switch circuit comprises:
a first switch comprising a first end coupled to the first output end of the input stage circuit, and a second end coupled to the first input end of the output stage circuit;
a second switch comprising a first end coupled to the second input end of the input stage circuit, and a second end coupled between the feedback voltage output end of the output stage circuit and the output end;
a third switch comprising a first end coupled to the second output end of the input stage circuit, and a second end coupled to the second input end of the output stage circuit;
a fourth switch comprising a first end coupled to the first output end of the input stage circuit, and a second end coupled to the first input end of the pseudo output stage circuit;
a fifth switch comprising a first end coupled to the second input end of the input stage circuit, and a second end coupled to the feedback voltage output end of the pseudo output stage circuit; and
a sixth switch comprising a first end coupled to the second output end of the input stage circuit, and a second end coupled to the second input end of the pseudo output stage circuit.

27. The amplifier device of claim 26, wherein the first switch, the second switch, and the third switch turn off, and the fourth switch, the fifth switch, and the sixth switch turn on when the operation mode is an offset voltage storing mode.

28. The amplifier device of claim 26, wherein the first switch, the second switch, and the third switch turn on, and the fourth switch, the fifth switch, and the sixth switch turn off when the operation mode is an offset voltage cancellation mode.

29. The amplifier device of claim 1 further comprising a voltage dividing circuit coupled between the output stage circuit and the switch circuit, for adjusting a gain of the amplified voltage corresponding to the input voltage.

30. The amplifier device of claim 29, wherein the voltage dividing circuit comprises:
a first resistor coupled between the output stage circuit and the switch circuit; and
a second resistor comprising one end coupled between the first resistor and the switch circuit, and another end coupled to a ground.

31. The amplifier device of claim 1, wherein the gain of the amplified voltage corresponding to the input voltage is 1.

* * * * *